(12) United States Patent
Zhang et al.

(10) Patent No.: US 8,524,441 B2
(45) Date of Patent: Sep. 3, 2013

(54) SILICON-BASED ANTIREFLECTIVE COATING COMPOSITIONS

(75) Inventors: Ruzhi Zhang, Pennington, NJ (US); WooKyu Kim, Bridgewater, NJ (US); David J. Abdallah, Bernardsville, NJ (US); PingHung Lu, Bridgewater, NJ (US); Mark O. Neisser, Whitehouse Station, NJ (US); Ralph R. Dammel, Flemington, NJ (US); Ari Karkkainen, Oulu (FI)

(73) Assignees: AZ Electronic Materials USA Corp., Somerville, NJ (US); Braggone Oy, Oulu (FI)

( * ) Notice: Subject to any disclaimer, the term of this patent is extended or adjusted under 35 U.S.C. 154(b) by 804 days.

(21) Appl. No.: 12/449,735

(22) PCT Filed: Feb. 25, 2008

(86) PCT No.: PCT/IB2008/000609
§ 371 (c)(1),
(2), (4) Date: Dec. 15, 2009

(87) PCT Pub. No.: WO2008/104881
PCT Pub. Date: Sep. 4, 2008

(65) Prior Publication Data
US 2010/0092895 A1    Apr. 15, 2010

Related U.S. Application Data

(60) Provisional application No. 60/891,828, filed on Feb. 27, 2007.

(51) Int. Cl.
C09D 183/04 (2006.01)
(52) U.S. Cl.
USPC ........ 430/272.1; 430/311; 430/325; 430/326; 430/323; 525/475; 525/477
(58) Field of Classification Search
None
See application file for complete search history.

(56) References Cited

U.S. PATENT DOCUMENTS

| | | | |
|---|---|---|---|
| 2,310,605 A | 2/1943 | Barnett | |
| 2,625,525 A | 1/1953 | Lynch | |
| 2,703,793 A | 3/1955 | Naylor, Jr. | |
| 2,778,812 A | 1/1957 | Dreisbach et al. | |
| 2,779,749 A | 1/1957 | Wicklatz | |
| 2,794,014 A | 5/1957 | Dreisbach et al. | |
| 2,899,412 A | 8/1959 | Caldwell et al. | |
| 2,943,077 A | 6/1960 | de Jong et al. | |
| 3,313,785 A | 4/1967 | Zutty | |
| 3,318,844 A | 5/1967 | Krantz | |
| 3,474,054 A | 10/1969 | White | |
| 3,663,507 A | 5/1972 | Vogel et al. | |
| 3,792,026 A | 2/1974 | Atkins at al. | |
| 3,884,696 A | 5/1975 | Bowden et al. | |
| 3,890,287 A | 6/1975 | Moore et al. | |
| 3,893,127 A | 7/1975 | Kaplan et al. | |
| 3,898,350 A | 8/1975 | Gipstein et al. | |
| 3,935,331 A | 1/1976 | Poliniak et al. | |
| 3,935,332 A | 1/1976 | Poliniak et al. | |
| 4,045,318 A | 8/1977 | Himics et al. | |
| 4,097,618 A | 6/1978 | Poliniak | |
| 4,126,712 A | 11/1978 | Poliniak et al. | |
| 4,153,741 A | 5/1979 | Poliniak et al. | |
| 4,200,729 A | 4/1980 | Calbo | |
| 4,251,665 A | 2/1981 | Calbo | |
| 4,267,257 A | 5/1981 | Poliniak et al. | |
| 4,289,845 A | 9/1981 | Bowden et al. | |
| 4,341,861 A | 7/1982 | Pampalone | |
| 4,355,094 A | 10/1982 | Pampalone et al. | |
| 4,393,160 A | 7/1983 | Pampalone | |
| 4,396,702 A | 8/1983 | Desai et al. | |
| 4,396,704 A | 8/1983 | Taylor | |
| 4,397,938 A | 8/1983 | Desai et al. | |
| 4,397,939 A | 8/1983 | Kilichowski | |
| 4,398,001 A | 8/1983 | Cheng et al. | |
| 4,405,776 A | 9/1983 | Pampalone et al. | |
| 4,409,317 A | 10/1983 | Shiraishi | |
| 4,491,628 A | 1/1985 | Ito et al. | |
| 4,504,372 A | 3/1985 | Kirchmayr et al. | |
| 4,751,168 A | 6/1988 | Tsuchiya et al. | |
| 4,808,697 A | 2/1989 | Drent | |
| 4,985,342 A | 1/1991 | Muramoto et al. | |
| 4,996,136 A | 2/1991 | Houlihan et al. | |

(Continued)

FOREIGN PATENT DOCUMENTS

| EP | 1 178 354 A1 | 2/2002 |
|---|---|---|
| EP | 1 905 795 A1 | 4/2008 |

(Continued)

OTHER PUBLICATIONS

Chemicalland21, "Propylene Glycol Monomethyl ether", http://www.chemicalland21.com/industrialchem/solalc/PROPYLENE%20GLYCOL%20MONOMETHYL%20ETHER.htm downloaded Nov. 28, 2012.*
English Language Abstract of KR 10-2007-0002602.
Office Action dated Oct. 28, 2011 from U.S. Appl. No. 12/449,750.
Office Action dated Aug. 17, 2011 from U.S. Appl. No. 12/464,170.
Form PCT/ISA/220, Form PCT/ISA/210, Form PCT/ISA/237 for PCT/IB2007/001982 dated Mar. 7, 2008, which corresponds to U.S. Appl. No. 11/425,813.
Form PCT/IB/326, Form PCT/IB/373, and Form PCT/ISA/237 for PCT/IB2007/001982 dated Jan. 8, 2009, which corresponds to U.S. Appl. No. 11/425,813.
Form PCT/ISA/220, Form PCT/ISA/210, Form PCT/ISA/237 for PCT/IB2008/000609 dated Jun. 27, 2008, which corresponds to U.S. Appl. No. 12/449,735.
Form PCT/IB/326, Form PCT/IB/373, and Form PCT/ISA/237 for PCT application PCT/IB2008/000609 dated Sep. 11, 2009, which Corresponds to U.S. Appl. No. 12/449,735.

(Continued)

*Primary Examiner* — Cynthia Hamilton
(74) *Attorney, Agent, or Firm* — Sangya Jain

(57) ABSTRACT

A polymer comprising a siloxane polymer having at least one Si—OH group and at least one Si—OR group, where R is condensation stabilizing group optionally having a reactive functional group, wherein the siloxane polymer, when placed into a solvent, has a weight average molecular weight increase of less than or equal to 50% after aging for one week at 40° C. as measured by GPC is provided.

16 Claims, No Drawings

(56) References Cited

U.S. PATENT DOCUMENTS

| | | |
|---|---|---|
| 5,072,024 A | 12/1991 | Cesa et al. |
| 5,100,503 A | 3/1992 | Allman et al. |
| 5,135,838 A | 8/1992 | Houlihan et al. |
| 5,187,019 A | 2/1993 | Calbo et al. |
| 5,200,544 A | 4/1993 | Houlihan et al. |
| 5,298,367 A | 3/1994 | Hoessel et al. |
| 5,314,978 A | 5/1994 | Kim et al. |
| 5,350,660 A | 9/1994 | Urano et al. |
| 5,384,376 A | 1/1995 | Tunney et al. |
| 5,457,003 A | 10/1995 | Tanaka et al. |
| 5,562,653 A | 10/1996 | Thompson |
| 5,728,506 A | 3/1998 | Kometani |
| 5,843,624 A | 12/1998 | Houlihan et al. |
| 5,853,808 A | 12/1998 | Arkles et al. |
| 5,871,872 A | 2/1999 | Matijevic et al. |
| 5,918,147 A | 6/1999 | Filipiak et al. |
| 5,919,598 A | 7/1999 | Flaim et al. |
| 5,926,740 A | 7/1999 | Forbes et al. |
| 6,069,259 A | 5/2000 | Crivello |
| 6,087,064 A | 7/2000 | Lin et al. |
| 6,139,920 A | 10/2000 | Smith et al. |
| 6,218,292 B1 | 4/2001 | Foote |
| 6,225,019 B1 | 5/2001 | Matsuda et al. |
| 6,265,073 B1 | 7/2001 | Nakamura et al. |
| 6,340,734 B1 | 1/2002 | Lin et al. |
| 6,379,014 B1 | 4/2002 | Li et al. |
| 6,420,088 B1 | 7/2002 | Angelopoulos et al. |
| 6,428,894 B1 | 8/2002 | Babich et al. |
| 6,447,980 B1 | 9/2002 | Rahman et al. |
| 6,479,212 B1 | 11/2002 | Matsuda et al. |
| 6,479,879 B1 | 11/2002 | Pike et al. |
| 6,503,692 B2 | 1/2003 | Angelopoulos et al. |
| 6,515,073 B2 | 2/2003 | Sakamoto et al. |
| 6,576,393 B1 | 6/2003 | Sugita et al. |
| 6,590,705 B1 | 7/2003 | Allen et al. |
| 6,596,404 B1 | 7/2003 | Albaugh et al. |
| 6,723,488 B2 | 4/2004 | Kudo et al. |
| 6,730,454 B2 | 5/2004 | Pfeiffer et al. |
| 6,737,117 B2 | 5/2004 | Boisvert et al. |
| 6,770,726 B1 | 8/2004 | Arkles et al. |
| 6,790,587 B1 | 9/2004 | Feiring et al. |
| 6,803,171 B2 | 10/2004 | Gronbeck et al. |
| 6,824,947 B2 | 11/2004 | Ishizuka et al. |
| 6,849,377 B2 | 2/2005 | Feiring et al. |
| 6,866,984 B2 | 3/2005 | Jung et al. |
| 6,872,456 B2 | 3/2005 | Boisvert et al. |
| 6,914,114 B2 | 7/2005 | Baldwin et al. |
| 6,916,543 B2 | 7/2005 | De et al. |
| 6,916,590 B2 | 7/2005 | Kaneko et al. |
| 6,919,114 B1 | 7/2005 | Darras et al. |
| 6,939,664 B2 | 9/2005 | Huang et al. |
| 6,939,753 B2 | 9/2005 | Lee |
| 6,956,097 B2 | 10/2005 | Kennedy et al. |
| 6,969,753 B2 | 11/2005 | Baldwin et al. |
| 7,033,729 B2 | 4/2006 | Jung et al. |
| 7,108,958 B2 | 9/2006 | Guerrero et al. |
| 7,115,532 B2 | 10/2006 | Daley |
| 7,202,013 B2 | 4/2007 | Ogihara et al. |
| 7,223,517 B2 | 5/2007 | Babich et al. |
| 7,264,913 B2 | 9/2007 | Wu et al. |
| 7,300,730 B1 | 11/2007 | Willis et al. |
| 7,390,613 B1 | 6/2008 | Rahman et al. |
| 7,416,834 B2 | 8/2008 | Abdallah et al. |
| 7,625,687 B2 | 12/2009 | Hu et al. |
| 7,662,985 B2 | 2/2010 | Yamahiro et al. |
| 7,691,556 B2 | 4/2010 | Wu et al. |
| 7,704,670 B2 | 4/2010 | Abdallah et al. |
| 7,736,837 B2 | 6/2010 | Abdallah et al. |
| 7,818,071 B2 | 10/2010 | Hartkamp et al. |
| 8,026,040 B2 | 9/2011 | Wu et al. |
| 2001/0034427 A1 | 10/2001 | Jung et al. |
| 2001/0036998 A1 | 11/2001 | Sakamoto et al. |
| 2002/0012876 A1 | 1/2002 | Angelopoulos et al. |
| 2002/0042020 A1 | 4/2002 | Gallagher et al. |
| 2002/0094593 A1 | 7/2002 | Chiou et al. |
| 2002/0128388 A1 | 9/2002 | Kennedy et al. |
| 2002/0198269 A1 | 12/2002 | Zampini et al. |
| 2003/0092854 A1 | 5/2003 | Yahagi et al. |
| 2003/0120018 A1 | 6/2003 | Baldwin et al. |
| 2003/0176614 A1 | 9/2003 | Hacker et al. |
| 2003/0198877 A1 | 10/2003 | Pfeiffer et al. |
| 2003/0209515 A1 | 11/2003 | Pavelchek |
| 2003/0219673 A1 | 11/2003 | Tao et al. |
| 2003/0219678 A1 | 11/2003 | Harada et al. |
| 2004/0013980 A1 | 1/2004 | Hatakeyama et al. |
| 2004/0014322 A1 | 1/2004 | Hwang et al. |
| 2004/0033444 A1* | 2/2004 | Otoguro et al. ............... 430/312 |
| 2004/0137241 A1 | 7/2004 | Lin et al. |
| 2004/0176488 A1 | 9/2004 | Mukherjee et al. |
| 2004/0247900 A1 | 12/2004 | Ogihara et al. |
| 2004/0253461 A1 | 12/2004 | Ogihara et al. |
| 2004/0253535 A1 | 12/2004 | Cameron et al. |
| 2005/0031964 A1 | 2/2005 | Babich et al. |
| 2005/0058929 A1 | 3/2005 | Kennedy et al. |
| 2005/0118541 A1 | 6/2005 | Ahn et al. |
| 2005/0123760 A1 | 6/2005 | Cammack et al. |
| 2005/0171277 A1 | 8/2005 | Li et al. |
| 2005/0239953 A1 | 10/2005 | Sakurai et al. |
| 2005/0277056 A1 | 12/2005 | Kim et al. |
| 2005/0277058 A1 | 12/2005 | Iwabuchi et al. |
| 2005/0277756 A1 | 12/2005 | Iwabuchi et al. |
| 2006/0058489 A1 | 3/2006 | Angelopoulos et al. |
| 2006/0105181 A1 | 5/2006 | Lin et al. |
| 2006/0141400 A1 | 6/2006 | Hirayama et al. |
| 2006/0141693 A1 | 6/2006 | Hagiwara et al. |
| 2006/0194916 A1 | 8/2006 | Zhong et al. |
| 2006/0252277 A1 | 11/2006 | Daley |
| 2006/0287454 A1 | 12/2006 | Yamahiro et al. |
| 2006/0292488 A1 | 12/2006 | Takayama et al. |
| 2007/0015977 A1 | 1/2007 | McCann et al. |
| 2007/0042289 A1 | 2/2007 | Thackeray et al. |
| 2007/0057253 A1 | 3/2007 | Gronbeck et al. |
| 2007/0097514 A1 | 5/2007 | Matsuzawa et al. |
| 2007/0117044 A1 | 5/2007 | Ogihara et al. |
| 2007/0117411 A1 | 5/2007 | Ogihara et al. |
| 2007/0225465 A1 | 9/2007 | Akiike et al. |
| 2007/0238300 A1 | 10/2007 | Ogihara et al. |
| 2007/0261600 A1 | 11/2007 | Zhong |
| 2007/0298349 A1 | 12/2007 | Zhang et al. |
| 2008/0008955 A1 | 1/2008 | Brodsky et al. |
| 2008/0020319 A1 | 1/2008 | Yeh et al. |
| 2008/0026322 A1 | 1/2008 | Ogihara et al. |
| 2008/0311530 A1 | 12/2008 | Allen et al. |
| 2009/0105360 A1 | 4/2009 | Niwa et al. |
| 2009/0123701 A1 | 5/2009 | Fu et al. |
| 2009/0130595 A1 | 5/2009 | Kawana et al. |
| 2009/0162800 A1 | 6/2009 | Abdallah et al. |
| 2009/0203839 A1 | 8/2009 | Karkkainen |
| 2009/0243018 A1 | 10/2009 | Karkkainen |
| 2009/0253884 A1 | 10/2009 | Ogawa et al. |
| 2009/0253886 A1 | 10/2009 | Nishikawa |
| 2009/0274974 A1 | 11/2009 | Abdallah et al. |
| 2010/0093969 A1 | 4/2010 | Zhang et al. |
| 2010/0291475 A1 | 11/2010 | Li |

FOREIGN PATENT DOCUMENTS

| | | |
|---|---|---|
| GB | 744264 A | 2/1956 |
| GB | 757046 A | 9/1956 |
| GB | 1118940 A | 7/1968 |
| JP | 5-125187 A | 5/1993 |
| JP | 2000-77575 A | 3/2000 |
| JP | 2002-179793 A | 6/2002 |
| JP | 2005-48152 A | 2/2005 |
| JP | 2005-128509 A | 5/2005 |
| JP | 2005-221534 A | 8/2005 |
| JP | 2007-279459 A | 10/2007 |
| KR | 10-2007-0002602 A | 1/2007 |
| WO | WO 86/05284 A1 | 9/1986 |
| WO | WO 03/044079 A1 | 5/2003 |
| WO | WO 2004/044025 A2 | 5/2004 |
| WO | WO 2004/113417 A1 | 12/2004 |
| WO | WO 2005/037907 A1 | 4/2005 |
| WO | WO 2007/011057 A1 | 1/2007 |

OTHER PUBLICATIONS

Form PCT/ISA/220, Form PCT/ISA/210, Form PCT/ISA/237 for PCT/IB2008/000518 dated Aug. 5, 2008, which corresponds to U.S. Appl. No. 12/449,750.
Form PCT/IB/326, Form PCT/IB/373, and Form PCT/ISA/237 for PCT/IB2008/000518 dated Sep. 3, 2009, which corresponds to U.S. Appl. No. 12/449,750.
Notification of the First Office Action dated Apr. 6, 2011 for Chinese Patent Application No. 200880006170.3, which corresponds to U.S. Appl. No. 12/449,750.
Eng. Lang. Trans. of Notification of the First Office Action dated Apr. 6, 2011 for Chinoso Patent Application No. 200880006170.3, which corresponds to U.S. Appl. No. 12/449,750.
Form PCT/ISA/220, Form PCT/ISA/210, Form PCT/ISA/237 for PCT/IB2008/003523 dated Jun. 25, 2009, which corresponds to U.S. Appl. No. 11/961,581.
Form PCT/IB/326, Form PCT/IB/373, and Form PCT/ISA/237 for PCT/IB2008/003523 dated Jul. 1, 2010, which corresponds to U.S. Appl. No. 11/961,581.
Form PCT/ISA/220, Form PCT/ISA/210, and Form PCT/ISA/237 for PCT/IB2009/005456 dated Oct. 9, 2009, which corresponds to U.S. Appl. No. 12/112,221.
Form PCT/IB/326, Form PCT/IB/373, and Form PCT/ISA/237 for PCT/IB2009/005456 dated Nov. 11, 2010 which corresponds to U.S. Appl. No. 12/112,221.
Office Action mail date Aug. 17, 2011 for U.S. Appl. No. 12/464,170.
B. Arkles et al., "High Density Silicon Dioxide Coatings by UV and Thermal Processing", Silicones in Coatings III, Mar. 28-30, 2000, Barcelona, Spain.
B. Arkles et al., "Staged Development of Modified Silicon Dioxide Films", Journal of Sol-Gel Science and Technology vol. 8, pp. 465-pp. 469 (1997).
R. Baney et al., "Silsesquioxanes", American Chemical Society, Chem. Rev. 1995, vol. 95, pp. 1409-pp. 1430 (1995).
C. Y. Chang et al., "A Novel Switchable BARC (SBARC) and Process to Improve Pattern Collapse and Defect Control", SPIE vol. 6153, Part 1, pp. 61530M-1-pp. 61530M-10 (2006).
R. E. Cook et al., Effect of Olefin Structure on the Ceiling Temperature for Olefin Paysulfone Formation, Journal of Polymer Science vol. XXVI, pp. 351-pp. 364 (1957).
Goldfarb et al., "Graded spin-on organic bottom antireflective coating for high NA lithography", SPIE vol. 6923, pp. 69230V-1-pp. 69230V-14 (2008), downloaded from SPIE Digital Library on Dec. 12, 2009.
Y. Huo et al., "Synthesis and Properties of Hybrid Organic-inorganic Materials Containing Covalently Bonded Luminescent Polygermanes", Chem. Mater. vol. 17, pp. 157-pp. 163 (2005).
Imae et al., "Unique photoluminescene property of a novel perfectly carbazole-substituted POSS", Journal of Materials Chemistry vol. 15, pp. 4581-pp. 4583 (2005).

Jiang et al., "Design and Synthesis of Thermally Labile Polymers for Microelectronics. Poly(vinyl tert-butyl carbonate sulfone)", Macromolecules 1991, vol. 24, No. '12, pp. 3528-3532.
Jiang et al., ."Poly(vinyl-t-butyl carbonate) synthesis and thermolisys to poly (vinyl alcohol)", Polymer Bulletin 1987, vol. 17, pp. 1-6.
Kennedy et al., "Organosiloxane based Bottom Antireflective Coatings for 193nm Lithography", SPIE vol. 5039, pp. 929-pp. 939 (2003)—11 Pages.
S. Kodama et al., "Synthesis of Novel Fluoropolymer for 157nm Photoresists by Cyclo-polymerization", SPIE vol. 4690, pp. 76-pp. 83 (2002)—8 Pagess.
Jerry March, Advanced Organic Chemistry; Reactions, Mechanisms, and Structure, Second Edition, McGraw-Hill Book Company 1977, New York, NY 1977, pp. 809, 810, and 1302.
Q. Pan et al., "Spin-on-glass thin films prepared from a novel polysilsesquioxane by thermal and ultraviolet-irradiation methods", Thin Solid Films vol. 345, pp. 244-pp. 254 (1999)—11 Pages.
pp. 41 and 42 from Gelest Reactive Silicones catalog, copyright 2004.
pp. 15-24 of Jun. 5, 2006 Chemical & Engineering News.
Sulfonium: Definition from Answers.com downloaded on Aug. 30, 2010 from http://www.answers.com/topic/sulfonium, 5 pages.
Notification of the First Office Action dated Sep. 15, 2011 for Chinese Patent Application No. 200880006441.5, which corresponds to U.S. Appl. No. 12/449,735.
English Translation of Notification of the First Office Action dated Sep. 15, 2011 for Chinese Patent Application No. 200880006441.5, which corresponds to U.S. Appl. No. 12/449,735.
Communication dated Apr. 10, 2012 for EP 11 19 5180, which corresponds to U.S. Appl. No. 11/676,673.
Notification of First Office Action dated Jan. 11, 2012 for Chinese Patent Application No. 200880005617.5, which corresponds to U.S. Appl. No. 11/676,673.
Engl. Lang. Translation of Notification of First Office Action dated Jan. 11, 2012 for Chinese Patent Application No. 200880005617.5, which corresponds to U.S. Appl. No. 11/676,673.
Office Action dated Feb. 24, 2012 from U.S. Appl. No. 12/449,750.
Office Action mail date Mar. 6, 2012 for U.S. Appl. No. 12/464,170.
Notification of the Second Office Action dated Jun. 19, 2012 for Chinese Patent Application No. 200880006441.5, which corresponds to U.S. Appl. No. 12/449,735.
Engl. Lang. Translation of Notification of the Second Office Action dated Jun. 19, 2012 for Chinese Patent Application No. 200880006441.5, which corresponds to U.S. Appl. No. 12/449,735.
Houlihan et al., "Phase transfer catalysis in the tert-butyloxycarbonylation of alcohols, phenols, nols, and thiols with di-tert-butyl dicarbonate", Can. J. Chem. 1985, vol. 63, pp. 153-162.

* cited by examiner

SILICON-BASED ANTIREFLECTIVE COATING COMPOSITIONS

This application is a United States National Stage Patent Application under 35 U.S.C. §371 of International Patent Application No. PCT/IB2008/000609, filed Feb. 25, 2008, which claims priority to U.S. Patent Application No. 60/891,828, filed, Feb. 27, 2007, the contents of all documents being hereby incorporated herein by reference.

FIELD OF THE INVENTION

This invention relates to silicon-based antireflective coating (ARC)/hardmask compositions having increased stability.

BACKGROUND OF THE INVENTION

In the microelectronics industry, the trend is to reduce the size of structural features. Microlithography employing effective photoresists provides the enabling techniques. However, as the feature miniaturization continues, there is a need to decrease the photoresist thickness as well. For some lithographic imaging processes, the thin photoresist used in advance microlithography can no longer provide enough masking budget for the substrate etching in order to achieve pattern transfer with high fidelity.

One solution to this problem is the utilization of a layer underlying the photoresist, which not only functions as antireflective coating, but also provides sufficient etch selectivity. This enhanced etch selectivity will allow this underlayer to be used as an image transfer intermediate. In the current state-of-the-art technology development, silicon-containing bottom anti-reflective coatings are employed to serve this purpose.

For some lithographic imaging processes, the resist used does not provide sufficient resistance (masking) to subsequent etching steps to enable effective transfer of the desired pattern to a layer underlying the resist. In many instances (e.g., where an ultrathin resist layer is desired, where the underlying material to be etched is thick, where a substantial etching depth is required, and/or where it is desired to use certain etchants for a given underlying material), a so-called hardmask layer is used intermediate between the resist layer and the underlying material to be patterned by transfer from the patterned resist. The hardmask layer receives the pattern from the patterned resist layer and should be able to withstand the etching processes needed to transfer the pattern to the underlying material.

In cases where the photoresist does not provide sufficient dry etch resistance, a combination of underlayers with antireflective properties can act as a hard mask. Resist images can easily be transferred to a silicone containing antireflective coating by etching with a fluorinated gas since F is highly reactive to silicone functionalities which decomposes the coating into gaseous Si—F species. This is highly necessary when breaking through the Si hard mask. On the other hand, high Si content masks have superior etch resistance when oxygen gas is used during etching since $SiO_2$ formation creates a hard mask while the organic underlayer is etched. Like photoresists, organic underlayers act as a mask for the substrate etch. In essence, a trilayer system is used with the goal of having both high etch resistance and low etch resistance under different conditions. In a trilayer system, a bottom layer (typically a carbon-based underlayer) is formed on a substrate (for example, Si-type), a silicon-based layer (Si-BARC) is coated over the bottom layer, and then a photoresist is formed over top of the silicon-based layer. Combining the requirements of elemental disparity between layers with antireflective properties is highly desirable for both lithography and pattern transfer.

Also, where the underlying material layer is excessively reflective of the imaging radiation used to pattern the resist layer, a thin antireflective coating is typically applied between the underlying layer and the resist layer. In some instances, the antireflection and hardmask functions may be served by the same material.

While many hardmask and antireflective coating materials exist in the prior art, there is a continued desire for improved compositions. Many of the prior art materials have stability issues, which decrease their shelf life, and thus are difficult to use. It would be desirable to have silicon-based antireflective coating/hardmask compositions that have increased stability and prolonged shelf life.

SUMMARY OF THE INVENTION

This invention relates to a comprising a siloxane polymer having at least one Si—OH group and at least one Si—OR group, where R is condensation stabilizing group optionally having a reactive functional group, wherein the siloxane polymer, when placed into a solvent, has a weight average molecular weight increase of less than or equal to 50% after aging for one week at 40° C. as measured by GPC. In some instances, the Si—OH groups and Si—OR groups are present in a ratio of from about 1:5 to about 5:1, preferably about 1:5 to about 1:1. The invention also provides for a coated substrate, the substrate having thereon a coating film of the above antireflective coating composition, the coated substrate being, for example, a silicon wafer or an organic (carbon-based) underlayer. In addition, the invention also provides for a method of forming a photorelief image where a substrate has a layer of the antireflective coating composition thereon and to which is then applied a chemically amplified photoresist composition. The substrate is preferably a carbon-based underlayer.

DETAILED DESCRIPTION OF THE INVENTION

This invention relates to a comprising a siloxane polymer having at least one Si—OH group and at least one Si—OR group, where R is condensation stabilizing group optionally having a reactive functional group, wherein the siloxane polymer, when placed into a solvent, has a weight average molecular weight increase of less than or equal to 50% after aging for one week at 40° C. as measured by GPC.

Preferably the alcohol selected from the group consisting of isopropanol, n-butanol, isobutanol, t-butanol, 1,2-propanediol, 1,2,3-propanetriol, ethyl lactate, propylene glycol monomethyl ether, 2-methyl-2-propanol, partially fluorinated and perfluorinated versions of the foregoing compounds, and mixtures thereof.

The polymer preferably, in $R_1$, $R_2$, and $R_3$ are each $C_{1-10}$ alkyl or aryl and $R_4$ is $C_{1-10}$ alkoxy or halogen, or each of $R_1$, $R_2$, $R_3$, and $R_4$ are $C_{1-10}$ alkoxy, halogen, siloxy, or siloxysilane, or each of $R_1$ and $R_2$ are $C_{1-10}$ alkoxy, halogen, siloxy, or siloxysilane and each of $R_3$ and $R_4$ are $C_{1-10}$ alkyl or aryl, or each of $R_1$, $R_2$, and $R_3$ are $C_{1-10}$ alkoxy, halogen, siloxy, or siloxysilane and $R_4$ is $C_{1-10}$ alkyl or aryl.

The condensation stabilizing group can be selected from the group trimethoxysilane, triethoxysilane, methyl dimethoxysilane, ethyl diethoxysilane, methyl dimethoxychlorosilane, methyl methoxydichlorosilane, diphenyl dichlorosilane, dimethyl t-butylchlorosilane, dimethyl methoxychlorosilane, methyl dimethoxychlorosilane, ethylmethoxydichlorosilane, diethyl methoxychlorosilane, tetramethoxysilane, tetraethoxysilane, tetra-n-propoxysilane, tetra-i-propoxysilane, tetra-n-butoxysilane, methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, n-butyltrimethoxysilane, n-butyltriethoxysilane, n-pentyltrimethoxysilane, n-hexyltrimethoxysilane, n-heptyltrimethoxysilane, n-octyltrimethoxysilane, vinyltrimethoxysilane, vinyltriethoxysilane, cyclohexyltrimethoxysilane, cyclohexyltriethoxysilane, phenyltrimethoxysilane, phenyltriethoxysilane, 3-chloropropyltrimethoxysilane, 3-chloropropyltriethoxysilane, 3,3,3-trifluoropropyltrimethoxysilane, 3,3,3-trifluoropropyltriethoxysilane, 2-hydroxyethyltrimethoxysilane, 2-hydroxyethyltriethoxysilane, 2-hydroxypropyltrimethoxysilane, 2-hydroxypropyltriethoxysilane, 3-hydroxypropyltrimethoxysilane, 3-hydroxypropyltriethoxysilane, 3-mercaptopropyltrimethoxysilane, 3-mercaptopropyltriethoxysilane, 3-isocyanatepropyltrimethoxysilane, 3-isocyanatepropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyl-triethoxysilane, (3-glycidoxypropyl)tripropoxysilane, 3-glycidoxypropyltri(2-methoxyethoxy)silane, 2,3-epoxypropyltriethoxysilane, 3,4-epoxybutyltriethoxysilane, 4,5-epoxypentyltriethoxysilane, 5,6-epoxyhexyltriethoxysilane, 5,6-epoxyhexyltrimethoxysilane, 4-(trimethoxysilyl)butane-1,2-epoxide, 3-(triethoxysilyl)propylsuccinic anhydride, 3-(trimethoxysilyl)propylsuccinic anhydride, 3-(methyldimethoxysilyl)propylsuccinic anhydride, 3-(methyldiethoxysilyl)propylsuccinic anhydride, 3-ureidopropyltrimethoxysilane, 3-ureidopropyltriethoxysilane, dimethyldimethoxysilane, dimethyldiethoxysilane, diethyldimethoxysilane, diethyldiethoxysilane, di-n-propyldimethoxysilane, di-n-propyldiethoxysilane, di-i-propyldimethoxysilane, di-i-propyldiethoxysilane, di-n-butyldimethoxysilane, di-n-butyldiethoxysilane, di-n-pentyldimethoxysilane, di-n-pentyldiethoxysilane, di-n-hexyldimethoxysilane, di-n-hexyldiethoxysilane, di-n-heptyldimethoxysilane, di-n-heptyldiethoxysilane, di-n-octyldimethoxysilane, di-n-octyldiethoxysilane, di-n-cyclohexyldimethoxysilane, di-n-cyclohexyldiethoxysilane, diphenyldimethoxy-silane, diphenyldiethoxysilane, methyltriacetyloxysilane, dimethyldiacetyloxy-silane, N-(3-triethoxysilylpropyl)-4-hydroxybutyramide, 3-(triethoxysilylpropyl)-p-nitrobenzamide, triethoxysilyipropylethylcarbamate, vinyltris(methylethylketoximino)silane, vinylmethyl-bis(methylethylketoximino)silane, tetrakis(methylethylketoximino)silane, phenyltris(methylethylketoximino)silane, diphenylbis(methylethylketoximino)-silane, dimethylbis(methylethylketoximino)silane, methyltris(methylethylketoximino)silane, 2-hydroxy-4-(3-triethoxysilylpropoxy)-diphenylketone, and 2-hydroxy-4-(3-methyldiethoxysilylpropoxy)diphenylketone, and mixtures thereof.

Preferably Y is selected from alkylene, —O-alkylene-O—, alkylene-O-alkylene, alkylene-$Z_1$C(=O)$Z_2$-alkylene, and —O-alkylene-$Z_1$C(=O)$Z_2$-alkylene-O—, where $Z_1$ and $Z_2$ are each selected from a direct bond or —O—.

More preferably the condensation stabilizing group is selected from the group bis(triethoxysilyl)ethane, 2,2-bis(allyloxymethyl)-1-trimethylsiloxybutane, 2,2-bis(3-triethoxysilylpropoxymethyl)-1-trimethylsiloxybutane, 3,3-bis(trichlorosilylpropoxymethyl)-5-oxa-tridecane, and 1,3-bis(3-trichlorosilylpropoxy)-2-decyloxypropane.

In some instances, the Si—OH groups and Si—OR groups are present in a ratio of from about 1:5 to about 5:1. The invention also provides for a coated substrate, the substrate having thereon a coating film of the above antireflective coating composition, the coated substrate being, for example, a silicon wafer (or others such as $SiO_2$, SiON, SiN, p-Si, α-Si, W, W—Si, Al, Cu, Al—Si and the like,) or an organic (carbon-based) underlayer. In addition, the invention also provides for a method of forming a photorelief image where a substrate has a layer of the antireflective coating composition thereon and to which is then applied a chemically amplified photoresist composition.

This invention discloses the modification of siloxane polymers by capping some, but not all, silanols or alkoxysilyl radicals or by silylation of reactive hydroxyl functionality. The modified silsesquioxane polymers exhibit enhanced stability and prolonged shelf life. The modified silsesquioxane polymer containing cross-linkable functionalities and chromophores can be used as anti-reflective coating or hardmask materials in lithographic processes.

Siloxane polymers are well known to those skilled in the art. Siloxane polymers are typically made up of silicon-based units based on the nomenclature of M-type, D-type, T-type, and Q-type, the structures of which are shown below.

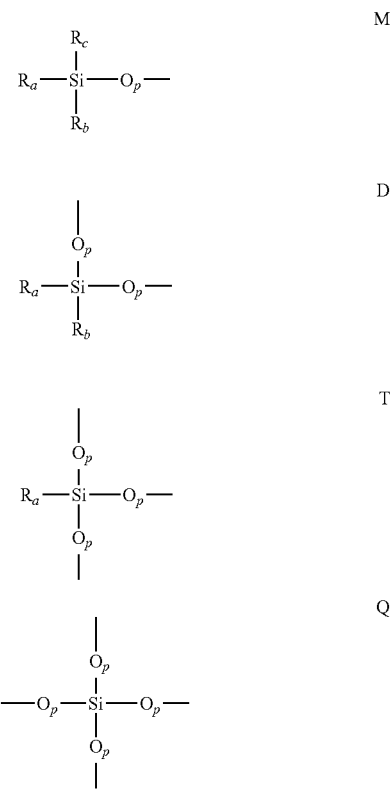

where $R_a$, $R_b$, and $R_c$ are selected from hydrocarbon, epoxy-functional, and anhydride-functional groups and p has a value of 0.5 when the associated oxygen atom is bonded to another silicon atom, and a value of 1 when the associated oxygen atom is bonded to other than a silicon atom.

The polymer of the invention typically comprises one or more trifunctional siloxane units (T),

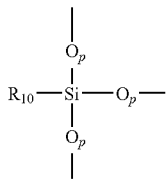

and one or more tetrafunctional siloxane units (Q),

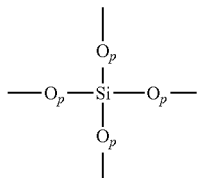

wherein p has a value of 0.5 when the associated oxygen atom is bonded to another silicon atom, and a value of 1 when the associated oxygen atom is bonded to other than a silicon atom, with the proviso that at least one p in each T and Q unit has a value of 0.5; each $R_{10}$ is independently selected from the group consisting of alkyl, alkenyl, alkynyl, cycloalkyl, aryl, alkaryl, aralkyl, (alkyl)acrylate, (alkyl)acryloxyalkyl, (alkyl) acryloxyalkenyl, an epoxy-functional group and an anhydride-functional group. In most cases, the sum of the number of T and Q units in the siloxane polymer will be greater than or equal to 50%.

Preferably at least one $R_{10}$ of the trifunctional siloxane units (T) is aryl.

Examples of T and Q units include triethoxysilane, tetraethoxysilane, methyltriethoxysilane, ethyltriethoxysilane, n-butyltriethoxysilane, phenyltriethoxysilane, 9-phenanthryltriethoxysilane, phenyltrimethoxysilane, tetramethoxysilane, methyltrimethoxysilane, methyltrichlorosilane, ethyltrichlorosilane, phenyltrichlorosilane, chlorotriethoxysilane, chlorotrimethoxysilane, chloromethyltriethoxysilane, chloroethyltriethoxysilane, chlorophenyltriethoxysilane, chloromethyltrimethoxysilane, chloroethyltrimethoxysilane, and chlorophenyltrimethoxysilane, 2-(3,4-epoxycyclohexyl)ethyltriethoxysilane, and the like.

When siloxane polymers are typically made, the end result is a polymer having numerous Si—OH bonds. These Si—OH bonds then become susceptible to hydrolysis, which makes compositions which contain these polymers with numerous Si—OH bonds to be unstable and have a short shelf life.

Applicants have found that by replacing some, but not all, of the Si—OH groups with Si—OR groups, compositions containing these polymers are more stable and have a longer shelf life. This can be measure by testing the siloxane polymer, which when placed into a solvent, has a weight average molecular weight increase of less than or equal to 50% after aging for one week at 40° C. as measured by GPC with molecular weight relative to polystyrene standards.

In replacing some of the Si—OH groups with Si—OR groups, R is condensation stabilizing group optionally having a reactive functional group. When there is a functional group on the condensation stabilizing group, it is possible then to have further crosslinking between the siloxane polymer with itself or with other materials, such as crosslinkers.

The condensation stabilizing group can be the residue of an alcohol; a compound having the formula $R_1R_2R_3SiR_4$, where each of $R_1$, $R_2$, $R_3$, and $R_4$ are individually selected from hydrogen, halide, $C_{1-10}$ alkyl, $C_{2-4}$ alkenyl, $C_{3-10}$ cycloalkyl, aryl, $C_{1-10}$ alkoxy, acyloxy, aryloxy, siloxy, siloxysilane, $NR_8R_9$, where each of $R_8$ and $R_9$ are selected from $C_{1-10}$ alkyl, $ON=CR_6R_7$, where $R_6$ and $R_7$ are each individually selected from hydrogen, $C_{1-10}$ alkyl, or $R_6$ and $R_7$ together with the carbon atom to which they are bound form a $C_{3-6}$ cycloalkyl ring; or a compound having the formula $(R_{12})_3$Si—Y—Si$(R_{12})_3$, where each $R_{12}$ is individually selected from $C_{1-4}$ alkyl, $C_{1-4}$ alkoxy, and halogen; and Y is a linking group.

When the condensation stabilizing group is the residue of an alcohol, the group can be introduced during the synthesis of the polymer (for example, polymerizing monomers in an alcohol solvent or polymerizing the monomers in a non-alcohol solvent and then transferring the polymer to an alcohol solvent) or during the formulation of an antireflective coating composition that contains the polymer by using an alcohol solvent as part of the composition.

When the condensation stabilizing group is a compound of formula $R_1R_2R_3SiR_4$ or $(R_{12})_3$Si—Y—Si$(R_{12})_3$, the compound can be reacted with the polymer, whereby the Si—OH groups are now replaced by Si—OR.

The alkyl, alkenyl, cycloalkyl, aryl, alkoxy, acyloxy, and aryloxy groups can be unsubstituted or substituted. Suitable substituents include those which, in the context of this invention, do not alter the properties of the groups, such as e.g., a halogen atom (e.g., fluorine, chlorine, bromine, iodine), hydroxy, alkoxy, mercapto, alkylmercapto, nitro, nitroso, cyano, sulfoxy, and the like. Examples of alkyl include methyl, butyl, isoamyl, and the like, alkenyl such as vinyl, allyl, and the like, cycloalkyl such as cyclohexyl, cyclopentyl, adamantyl, and the like, alkoxy such as, for example, methoxy group, ethoxy group, hydroxyethoxy group, propoxy group, hydroxypropoxy group, n-butoxy group, isobutoxy group, sec-butoxy group and t-butoxy group, aryl such as phenyl group, aryloxy such as phenoxy group, and acyloxy such as acetoxy.

Examples of epoxy-functional groups include (3-glycidoxypropyl)trimethoxysilane,(3-glycidoxypropyl)triethoxysilane, (3-glycidoxypropyl)tripropoxysilane, 3-glycidoxypropyltri(2-methoxyethoxy)silane, 2,3-epoxypropyltriethoxysilane, 3,4-epoxybutyltriethoxysilane, 4,5-epoxypentyltriethoxysilane, 5,6-epoxyhexyltriethoxysilane, 5,6-epoxyhexyltrimethoxysilane, 2-(3,4-epoxycyclohexyl)ethyltriethoxysilane, 2-(3,4-epoxycyclohexyl)ethyltrimethoxysilane, 4-(trimethoxysilyl)butane-1,2-epoxide. Examples of an anhydride-functional group include 3-(triethoxysilyl)propylsuccinic anhydride, 3-(trimethoxysilyl)propylsuccinic anhydride, 3-(methyldimethoxysilyl)propylsuccinic anhydride, and 3-(methyldiethoxysilyl) propylsuccinic anhydride.

The linking group Y can be selected from alkylene, —O-alkylene-O—, alkylene-O-alkylene, alkylene-$Z_1$C(=O)$Z_2$-alkylene, and —O-alkylene-$Z_1$C(=O)$Z_2$-alkylene-O—, where $Z_1$ and $Z_2$ are each selected from a direct bond or —O—. Examples of $(R_{12})_3$Si—Y—Si$(R_{12})_3$ include bis(triethoxysilyl)ethane, 2,2-bis(allyloxymethyl)-1-trimethylsiloxybutane, 2,2-bis(3-triethoxysilylpropoxymethyl)-1-trimethylsiloxybutane, 3,3-bis(trichlorosilylpropoxymethyl)-5-oxa-tridecane, and 1,3-bis(3-trichlorosilylpropoxy)-2-decyloxypropane.

In some instances, the aryl group will act as a chromophore, and can include, but are not limited to, unsubstituted and substituted fluorene, vinylenephenylene, anthracene, perylene, phenyl, benzyl, chalcone, phthalimide, pamoic acid, acridine, azo compounds, dibenzofuran, any derivatives thereof thiophenes, anthracene, naphthalene, benzene, chalcone, phthalimides, pamoic acid, acridine, azo compounds, chrysenes, pyrenes, fluoranthrenes, anthrones, benzophenones, thioxanthones, heterocyclic aromatic rings containing heteroatoms selected from oxygen, nitrogen, sulfur, and combinations thereof, as well as derivatives of the foregoing.

The compositions of the invention are generally prepared following known procedures and methods. An example is an antireflective coating composition prepared by dissolving the components of the antireflective coating in a suitable solvent such as, for example, glycol ether such as ethylene glycol monomethyl ether, propylene glycol monomethyl ether, or an alcohol. Typically the solids content of the antireflective coating composition varies between 1 and 35 percent by weight of the total weight of the antireflective coating composition.

The composition can be coated on the substrate using techniques well known to those skilled in the art, such as dipping, spin-coating or spraying. The film thickness of the anti-reflective coating ranges from about 0.01 µm to about 1 µm. The coating can be heated on a hot plate or convection oven or other well known heating methods to remove any residual solvent and induce crosslinking if desired, and insolubilizing the anti-reflective coatings to prevent intermixing between the anti-reflective coating and the photoresist.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Negative working photoresist and positive working photoresist compositions and their use are well known to those skilled in the art.

In a trilayer resist working process, an undercoat-forming material is applied onto a processable substrate (or film) lying on a support substrate to form an undercoat layer, in the same manner as in a traditional bilayer resist process. A silicon-containing intermediate layer is then formed on the undercoat layer, and a single layer photoresist layer is formed on the intermediate layer. Next, a predetermined region of the photoresist layer is exposed to light. By subsequent PEB and development, a patterned photoresist layer is formed. Further processing, for example, using the patterned photoresist layer as a mask and etching the intermediate layer, removing the patterned photoresist layer, etching the undercoat layer by using the patterned intermediate layer as a mask, and then removing the patterned intermediate layer, after which the processable substrate is processed by etching.

A process of the instant invention comprises coating a substrate with a composition of this invention and heating the substrate on a hotplate or convection oven or other well known heating methods at a sufficient temperature for sufficient length of time to remove the coating solvent, and crosslink the polymer, to a sufficient extent so that the coating is not soluble in the coating solution of a photoresist or in a aqueous alkaline developer. Furthermore the coating should be crosslinked sufficiently during the curing to prevent any intermixing or diffusion between the polymer coating and the coating solution of a photoresist. An edge bead remover may be applied to clean the edges of the substrate using processes well known in the art. The heating ranges in temperature from about 70° C. to about 250° C. If the temperature is below 70° C. then insufficient loss of solvent or insufficient amount of crosslinking may take place, and at temperatures above 250° C., the polymer may become chemically unstable. A film of a photoresist composition is then coated on top of the anti-reflective coating and baked to substantially remove the photoresist solvent. The photoresist is image-wise exposed and developed in an aqueous developer to remove the treated resist. An optional heating step can be incorporated into the process prior to development and after exposure. The process of coating and imaging photoresists is well known to those skilled in the art and is optimized for the specific type of resist used. The patterned substrate can then be dry etched in a suitable etch chamber to remove the exposed portions of the anti-reflective film, with the remaining photoresist acting as an etch mask.

The following specific examples will provide detailed illustrations of the methods of producing and utilizing compositions of this invention. These examples are not intended, however, to limit or restrict the scope of the invention in any way and should not be construed as providing conditions, parameters or values which must be utilized exclusively in order to practice the invention.

Example 1

In a three-neck 250 mL round-bottom flask equipped with a magnetic stirrer, thermometer, and condenser, was charged 35.00 g of 2-(3,4-epoxycyclohexyl)ethyl trimethoxysilane (142 mmol), 8.50 g of phenyltrimethoxysilane (43 mmol), and 4.50 g of methyltrimethoxysilane (33 mmol). To the flask, was added a mixture of 7.90 g of D.I. water, 2.00 g of acetic acid, and 45 g of THF. The mixture was heated to reflux and kept at that temperature for 3 hours. Then, the mixture was cooled to room temperature. The solvents were removed under reduced pressure to afford 45.78 g of a colorless liquid resin. The weight average molecular weight is approximately 2,430 g/mol, determined by gel permeation chromatography using polystyrene as reference. FT-IR indicated the presence of hydroxyl groups.

Example 2

In a three-neck 250 mL round-bottom flask equipped with a magnetic stirrer, thermometer, and condenser, was charged 32.10 g of the silsesquioxane resin prepared in Example 1, 16.00 g of triethylamine, and 16 mL of THF. To this mixture, was added dropwise 147 mL of trimethylchlorosilane (1.0M trimethylchlorosilane in tetrahydrofuran) and the mixture was maintained below 10° C. Upon completion of addition, the mixture was heated to reflux and that temperature was maintained for 4 hours. The mixture was cooled to room temperature and filtered. The solvent was removed under reduced pressure. The recovered oil was dissolved in 100 mL of toluene and the organic phase was washed with D.I. water (2×100 mL). The organic layer was dried, filtered, and the solvent was removed under reduced pressure. 26.77 g of a liquid resin was obtained. The weight average molecular weight is approximately 3,380 g/mol, determined by gel permeation chromatography using polystyrene as reference. FT-IR indicated that there was almost no hydroxyl peak in this modified resin.

Samples of polymers from Example 1 and Example 2 were placed in 20 mL vials and placed in a fume hood, open to atmosphere at room temperature. After 3 months, it was observed that the Example 1 polymer gelled and was no longer soluble in common organic solvents. In contrast, Example 2 polymer did not gel and was readily soluble in common organic solvents.

Example 3

In a three-neck 250 mL round-bottom flask equipped with a magnetic stirrer, thermometer, and condenser, was charged 28.00 g of 3-(trimethoxysilyl)propyl methacrylate (113 mmol), 6.50 g of phenyltrimethoxysilane (33 mmol), and 2.00 g of methyltrimethoxysilane (15 mmol). To the flask, was added a mixture of 4.40 g of D.I. water, 1.50 g of acetic acid, and 14.10 g of isopropanol. The mixture was heated to reflux and kept at that temperature for 1.5 hours. Then, the mixture was cooled to room temperature. The solvents were removed under reduced pressure to afford 28.86 g of a colorless liquid resin. The weight average molecular weight is approximately 2,920 g/mol, determined by gel permeation chromatography using polystyrene as reference. FT-IR indicated the presence of hydroxyl groups.

Example 4

In a three-neck 100 mL round-bottom flask equipped with a magnetic stirrer, thermometer, and condenser, was charged 5.00 g of hexamethyldisiloxane, 0.50 g of hydrochloric acid, and 5.00 g of absolute ethanol. The mixture was agitated and heated to approximately 70° C. To this mixture, was added dropwise 10.00 g of the silsesquioxane resin prepared in Example 3. Upon completion of addition, the temperature was maintained at reflux for two hours. Then, the mixture was cooled to room temperature and 50 mL of toluene was added. The organic phase was washed with saturated sodium bicarbonate (50 mL), followed by D.I. water (2×50 mL). The organic layer was dried, filtered, and the solvent was removed under reduced pressure. 7.82 g of a liquid resin was obtained. FT-IR indicated that there was almost no hydroxyl peak in this modified resin.

Example 5

12 g of a siloxane polymer solution [obtained from Braggone Oy, Finland, #102227, described more fully in U.S. Patent Application 60/813,266, the contents of which are hereby incorporated herein by reference. Synthesis procedure of the polymer being as follows: Phenyltrimethoxysilane (1.60 g, 5 mol %), tetraethoxysilane (26.81 g, 80 mol %) and Phenanthrene-9-triethoxysilane (8.24 g, 15 mol %) were weighed to a round bottom flask. 73.3 g of acetone was added to the round bottom flask. 10.75 g of water (0.01 M HCl) was added to the reaction flask within 5 min, while constantly stirring the reaction mixture using a magnetic stirrer. After this the reaction mixture was stirred at room temperature (RT) for 27 min and refluxed for 5 hours using electric mantel. After the refluxing, most of the acetone was removed from the reaction mixture using a rotary evaporator (pressure 350->250 mbar, t(bath)=50° C.). After most of the acetone was removed, 72 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the material solution was refluxed at 120 C for 2 hours. After the 2 hour refluxing step the material is ready to use after dilution and filtration. The material was diluted (by adding PGMEA) to 20% solid content and filtrated using 0.1 μm PTFE filter.] were mixed with 17.33 g of PGMEA. The mixed solution was filtered with a 0.2 μm membrane filter. The filtered solution was applied to a silicon wafer by spin coating at 1300 rpm and baked at 250° C. for 90 seconds. Optical constants, refractive index (n) and absorption parameter (k), and film thicknesses were measured on a J. A. Woollam® VUV VASE® Spectroscopic Ellipsometer. The refractive index (n) was 1.60 and the absorption parameter (k) was 0.25 at a film thickness of 100 nm.

Example 6

6.5 g of a polymer solution [obtained from Braggone Oy, Finland, #102267, described more fully in U.S. Patent Application 60/813,266, the contents of which are hereby incorporated herein by reference: Synthesis procedure of the polymer being as follows: Phenyltrimethoxysilane (4.80 g, 5 mol %), tetraethoxysilane (85.47 g, 85 mol %) and Phenanthrene-9-triethoxysilane (16.47 g, 10 mol %) were weighed to a round bottom flask. 213.48 g of acetone was added to the round bottom flask. 33.48 g of water (0.01 M HCl) was added to the reaction flask within 4 min, while constantly stirring the reaction mixture using a magnetic stirrer. After this the reaction mixture was stirred at RT for 26 min and refluxed for 5 hours using electric mantel. After the refluxing, most of the acetone was removed from the reaction mixture using a rotary evaporator (pressure 400->200 mbar, t(bath)=50° C.). After most of the acetone was removed, 105 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the material solution was refluxed at 120 C for 2 hours. After the 2 hour refluxing step the material is ready to use after dilution and filtration. The material was diluted (by adding PGMEA) to 20% solid content and filtrated using 0.1 μm PTFE filter.] were mixed with 9.29 g of PGMEA and 6.21 g of PGME. The mixed solution was filtered with a 0.2 μm membrane filter. The filtered solution was applied to a bare silicon wafer by spin coating at 2300 rpm and baked at 250° C. for 90 seconds. Optical constants, n and k, and film thicknesses were measured on a J. A. Woollam® VUV VASE® Spectroscopic Ellipsometer. The refractive index (n) was 1.60 and the absorption parameter (k) was 0.25 at a film thickness of 100 nm.

Example 7

(a) 835 g of a polymer solution [obtained from Braggone Oy, Finland, #102288 (same composition as 102227 only larger scale reaction), described more fully in U.S. Patent Application 60/813,266, the contents of which are hereby incorporated herein by reference. Synthesis procedure of the polymer being as follows: Phenyltrimethoxysilane (80 g, 5 mol %), tetraethoxysilane (1340.5 g, 80 mol %) and Phenanthrene-9-triethoxysilane (412 g, 15 mol %) were weighed to a round bottom flask. 3665.0 g of acetone was added to the round bottom flask. 550.74 g of water (0.01 M HCl) was added to the reaction flask within 5 min, while constantly stirring the reaction mixture using a magnetic stirrer. After this the reaction mixture was stirred at RT for 27 min and refluxed for 5 hours using electric mantel. After the refluxing, most of the acetone was removed from the reaction mixture using a rotary evaporator (pressure 350->250 mbar, t(bath) =50° C.). After most of the acetone was removed, 600 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the material solution was refluxed at 120 C for 2 hours. After the 2 hour refluxing step the material is ready to use after dilution and filtration. The material was diluted (by adding PGMEA) to 20% solid content and filtrated using 0.1 µm PTFE filter.] was mixed with 2715.1 g of PGMEA and 1449.0 g of PGME. The mixed solution was fine-filtered. The filtered solution was divided into 1 liter Now-Pak® containers and sealed. The filled containers were stored in a water bath with temperature set at 40° C. for 8 days.

(b) 835 g of a polymer solution (obtained from Braggone Oy, Finland, #102288) was mixed with 4164.1 g of PGMEA. The mixed solution was fine-filtered. The filtered solution was divided into 1 liter Now-Pak® containers and sealed. The filled containers were stored in a water bath with temperature set at 40° C. for 8 days.

Particle counts (0.2 µm and 0.3 µm particles) of the solutions in (a) and (b) were monitored over 8 days using a KS41 liquid particle counter (LPC) from Rion. Solution (a) had 6 to 10 times less number of LPC counts than Solution (b).

Example 8

A silicon substrate was coated with the solution of Example 5 and baked at 250° C. for 90 sec. The baked film had a film thickness of 110 nm. A photoresist solution, AZ® AX2110P (available from AZ Electronic Materials, Somerville, New Jersey), was coated over the baked film. The spin speed was adjusted such that the photoresist film thickness was 130 nm. The coated wafers were soft baked at 100° C. for 60 seconds. The coated wafers were exposed on a Nikon 306D 193 nm scanner to which a TEL® ACT 12 track was linked; NA was 0.85; illumination, Y-dipole, 6% attenuated phase shift reticle. The exposed wafers were then post-exposure baked at 110° C. for 60 seconds. The films were developed in 0.26N TMAH aqueous solution for 30 seconds. The imaged photoresist features were analyzed using SEM. Line and space photoresist features were observed for 80 nm L/S and 75 nm L/S.

Example 9

(a) A polymer solution [made by Braggone Oy, Finland, #102288 (same composition as 102227 only larger scale reaction), described more fully in U.S. Patent Application 60/813, 266, the contents of which are hereby incorporated herein by reference. Synthesis procedure of the polymer being as follows: Phenyltrimethoxysilane (80 g, 5 mol %), tetraethoxysilane (1340.5 g, 80 mol %) and Phenanthrene-9-triethoxysilane (412 g, 15 mol %) were weighed to a round bottom flask. 3665.0 g of acetone was added to the round bottom flask. 550.74 g of water (0.01 M HCl) was added to the reaction flask within 5 min, while constantly stirring the reaction mixture using a magnetic stirrer. After this the reaction mixture was stirred at RT for 27 min and refluxed for 5 hours using electric mantel. After the refluxing, most of the acetone was removed from the reaction mixture using a rotary evaporator (pressure 350->250 mbar, t(bath)=50° C.). After most of the acetone was removed, 600 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the material solution was refluxed at 120 C for 2 hours. After the 2 hour refluxing step the material is ready to use after dilution and filtration. The material was diluted (by adding PGMEA) to 25% solid content.] was characterized using H-NMR. The H-NMR measurements indicate that there were no alkoxy groups present after the synthesis, only hydroxyl groups were present.

(b) A polymer solution [made by Braggone Oy, Finland, #102288 (same composition as 102227 only larger scale reaction), described more fully in U.S. Patent Application 60/813, 266, the contents of which are hereby incorporated herein by reference. Synthesis procedure of the polymer being as follows: Phenyltrimethoxysilane (80 g, 5 mol %), tetraethoxysilane (1340.5 g, 80 mol %) and Phenanthrene-9-triethoxysilane (412 g, 15 mol %) were weighed to a round bottom flask. 3665.0 g of acetone was added to the round bottom flask. 550.74 g of water (0.01 M HCl) was added to the reaction flask within 5 min, while constantly stirring the reaction mixture using a magnetic stirrer. After this the reaction mixture was stirred at RT for 27 min and refluxed for 5 hours using electric mantel. After the refluxing, most of the acetone was removed from the reaction mixture using a rotary evaporator (pressure 350->250 mbar, t(bath)=50° C.). After most of the acetone was removed, 600 g of PGMEA was added to the flask. The reaction mixture was evaporated further in the rotary evaporator (pressure 45 mbar, t(bath)=50° C., 1 hour) after PGMEA addition to perform a solvent exchange. After the solvent exchange the material solution was refluxed at 120 C for 2 hours. After the 2 hour refluxing step the material is ready to use after dilution and filtration. The material was diluted (by adding PGMEA) to 20% solid content and filtrated using 0.1 µm PTFE filter. After adding the PGMEA the material solution was further diluted by PGME to result in 11% final solid content and 1:1 PGMEA:PGME solution.] was characterized using H-NMR. The H-NMR measurements indicate that there were no alkoxy groups present after the synthesis, only hydroxyl groups were present. The polymer solution was further diluted and filtered again using 0.2 µm filter. The filtered solution was applied to a silicon wafer by spin coating and baked at 250° C. for 90 seconds. Optical constants, refractive index (n) and absorption parameter (k), and film thicknesses were measured on a J. A. Woollam® VUV VASE® Spectroscopic Ellipsometer. The refractive index (n) was 1.61 and the absorption parameter (k) was 0.27 at a film thickness of 100 nm.

(c) A polymer solution [made by Braggone Oy, Finland, was synthesized using the following procedure: Phenyltrimethoxysilane (13.10 g, 5 mol %), tetraethoxysilane (219.99 g, 80 mol %) and Phenanthrene-9-triethoxysilane (67.58 g, 15 mol %) were weighed to a round bottom flask. 300.66 g of PGME was added to the round bottom flask. 90.29 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed (203 g of PGME was added). After the solvent exchange the material solution was refluxed at 120 C for 2 hours. After the 2 hour refluxing step the material is ready to use after dilution and filtration. The material was diluted (by adding PGME) to 20% solid content and filtrated using 0.1 μm PTFE filter.] was characterized using H-NMR. The H-NMR measurements indicate that there were both alkoxy groups and hydroxyl groups present after the synthesis. The ratio of hydroxyl groups to alkoxy groups was 3:1, as determined by NMR. The polymer solution was further diluted and filtered again using 0.2 μm filter. The filtered solution was applied to a silicon wafer by spin coating and baked at 250° C. for 90 seconds. Optical constants, refractive index (n) and absorption parameter (k), and film thicknesses were measured on a J. A. Woollam® VUV VASE® Spectroscopic Ellipsometer. The refractive index (n) was 1.61 and the absorption parameter (k) was 0.24 at a film thickness of 100 nm.

(d) A polymer solution [made by Braggone Oy, Finland, was synthesized using the following procedure: Phenyltrimethoxysilane (26.2 g, 5 mol %), tetraethoxysilane (385.28 g, 70 mol %) and Phenanthrene-9-triethoxysilane (135.16 g, 15 mol %) were weighed to a round bottom flask. 601.36 g of PGME was added to the round bottom flask. 180.58 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed (413 g of PGME was added). After the solvent exchange the material solution was refluxed at 120 C for 1 hour and cooled down to the room temperature. After this tetraethoxysilane (55.05 g, 10 mol %) was added and the material solution was refluxed at 120 C for 1 hour. After the second refluxing step the material is ready to use after dilution and filtration. The material was diluted (by adding PGME) to 20% solid content and filtrated using 0.1 μm PTFE filter.] was characterized using H-NMR. The H-NMR measurements indicate that there were both alkoxy groups and hydroxyl groups present after the synthesis. The ratio of hydroxyl groups to alkoxy groups was 2.5:1, as determined by NMR. The polymer solution was further diluted and filtered again using 0.2 μm filter. The filtered solution was applied to a silicon wafer by spin coating and baked at 250° C. for 90 seconds, forming a film having a thickness of 100 nm as measured on a J. A. Woollam® VUV VASE® Spectroscopic Ellipsometer.

(e) A polymer solution [made by Braggone Oy, Finland, was synthesized using the following procedure: Phenyltrimethoxysilane (44.62 g, 15 mol %), tetraethoxysilane (250.00 g, 80 mol %) and Phenanthrene-9-triethoxysilane (25.62 g, 5 mol %) were weighed to a round bottom flask. 320.24 g of IPA/PGME mixture (1:1) was added to the round bottom flask. 102.60 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed from IPA/PGME mixture to PGME (200 g of PGME was added). After the solvent exchange the material solution was refluxed at 120 C for 2 hours. After refluxing the material is ready to use after dilution and filtration. The material was diluted (by adding PGME) to 20% solid content and filtrated using 0.1 μm PTFE filter.] was characterized using H-NMR. The H-NMR measurements indicate that there were both alkoxy groups and hydroxyl groups present after the synthesis. The ratio of hydroxyl groups to alkoxy groups was 4:1, as determined by NMR. The polymer solution was further diluted and filtered again using 0.2 μm filter. The filtered solution was applied to a silicon wafer by spin coating and baked at 250° C. for 90 seconds. Optical constants, refractive index (n) and absorption parameter (k), and film thicknesses were measured on a J. A. Woollam® VUV VASE® Spectroscopic Ellipsometer. The refractive index (n) was 1.70 and the absorption parameter (k) was 0.36 at a film thickness of 100 nm.

(f) A polymer solution [made by Braggone Oy, Finland, was synthesized using the following procedure: Phenyltrimethoxysilane (25.05 g, 10 mol %), tetraethoxysilane (150.00 g, 57 mol %), Phenanthrene-9-triethoxysilane (12.95 g, 3 mol %) and methyltriethoxysilane (67.57 g, 30 mol %) were weighed to a round bottom flask. 255.57 g of PGME was added to the round bottom flask. 81.16 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed (200 g of PGME was added). After the solvent exchange the material solution was refluxed at 120 C for 2 hours. After refluxing the material is ready to use after dilution and filtration. The material was diluted (by adding PGME) to 20% solid content and filtrated using 0.1 μm PTFE filter.] was characterized using H-NMR. The H-NMR measurements indicate that there were both alkoxy groups and hydroxyl groups present after the synthesis. The ratio of hydroxyl groups to alkoxy groups was 1.5:1, as determined by NMR. The polymer solution was further diluted and filtered again using 0.2 μm filter. The filtered solution was applied to a silicon wafer by spin coating and baked at 250° C. for 90 seconds. Optical constants, refractive index (n) and absorption parameter (k), and film thicknesses were measured on a J. A. Woollam® VUV VASE® Spectroscopic Ellipsometer. The refractive index (n) was 1.68 and the absorption parameter (k) was 0.21 at a film thickness of 100 nm.

(g) A polymer solution [made by Braggone Oy, Finland, was synthesized using the following procedure: Phenyltrimethoxysilane (25.05 g, 10 mol %), tetraethoxysilane (150.0 g, 57 mol %), Phenanthrene-9-triethoxysilane (12.95 g, 3 mol %) and methyltriethoxysilane (45.05 g, 20 mol %) were weighed to a round bottom flask. 255.57 g of PGME was added to the round bottom flask. 81.16 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed (204 g of PGME was added). After the solvent exchange the material solution was refluxed at 120 C for 1 hour and cooled down to the room temperature. After this methyltriethoxysilane (22.52 g, 10 mol %) was added and the material solution was refluxed at 120 C for 1 hour. After the second refluxing step the material is ready to use after dilution and filtration. The material was diluted (by adding PGME) to 20% solid content and filtrated using 0.1 μm PTFE filter.] was characterized using H-NMR. The H-NMR measurements indicate that there were both alkoxy groups and hydroxyl groups present after the synthesis. The ratio of hydroxyl groups to alkoxy groups was 3:1, as determined by NMR. The polymer solution was further diluted and filtered again using 0.2 μm filter. The filtered solution was applied to a silicon wafer by spin coating and baked at 250° C. for 90 seconds. Optical constants, refractive index (n) and absorption parameter (k), and film thicknesses were measured on a J. A. Woollam® VUV VASE® Spectroscopic Ellipsometer. The refractive index (n) was 1.68 and the absorption parameter (k) was 0.21 at a film thickness of 100 nm.

(h) A polymer solution [made by Braggone Oy, Finland, was synthesized using the following procedure: Phenyltrimethoxysilane (25.09 g, 10 mol %), tetraethoxysilane (150.10 g, 57 mol %), Phenanthrene-9-triethoxysilane (12.93 g, 3 mol %) and methyltriethoxysilane (45.09 g, 20 mol %) were weighed to a round bottom flask. 255.57 g of PGME was added to the round bottom flask. 81.43 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed from PGME to PGMEA (250 g of PGMEA was added). After the solvent exchange the material solution was refluxed at 120 C for 1 hour and cooled down to the room temperature. After this methyltriethoxysilane (22.54 g, 10 mol %) was added and the material solution was refluxed at 120 C for 1 hour. After the second refluxing step the material is ready to use after dilution and filtration. The material was diluted (by adding PGMEA) to 20% solid content and filtrated using 0.1 μm PTFE filter.] was characterized using H-NMR. The H-NMR measurements indicate that there were both alkoxy groups and hydroxyl groups present after the synthesis. The ratio of hydroxyl groups to alkoxy groups was 2:1, as determined by NMR. The polymer solution was further diluted and filtered again using 0.2 μm filter. The filtered solution was applied to a silicon wafer by spin coating and baked at 250° C. for 90 seconds, forming a film having a thickness of 100 nm as measured on a J. A. Woollam® VUV VASE® Spectroscopic Ellipsometer.

(i) A polymer solution [made by Braggone Oy, Finland, was synthesized using the following procedure: Phenyltrimethoxysilane (28.43 g, 10 mol %), tetraethoxysilane (230.0 g, 77 mol %), Phenanthrene-9-triethoxysilane (14.69 g, 3 mol %) and triethoxysilane (23.55 g, 10 mol %) were weighed to a round bottom flask. 296.67 g of IPA/PGME mixture (1:1) was added to the round bottom flask. 97.25 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed from IPA/PGME mixture to PGME (202 g of PGME was added). After the solvent exchange the material solution was refluxed at 120 C for 2 hours. After refluxing step the material is ready to use after dilution and filtration. The material was diluted (by adding PGME) to 20% solid content and filtrated using 0.1 μm PTFE filter.] was characterized using H-NMR. The H-NMR measurements indicate that there were both alkoxy groups and hydroxyl groups present after the synthesis. The ratio of hydroxyl groups to alkoxy groups was 3:1, as determined by NMR. The polymer solution was further diluted and filtered again using 0.2 μm filter. The filtered solution was applied to a silicon wafer by spin coating and baked at 250° C. for 90 seconds. Optical constants, refractive index (n) and absorption parameter (k), and film thicknesses were measured on a J. A. Woollam® VUV VASE® Spectroscopic Ellipsometer. The refractive index (n) was 1.68 and the absorption parameter (k) was 0.26 at a film thickness of 100 nm.

The polymers from (a) to (i) were obtained from Braggone Oy, Finland.

Solution samples of (a) to (i) were allowed to age at 40° C. for 7 days. Non-aged samples of (b) to (i) were coated on silicon wafers, baked for 60 sec at 240° C. to form a film having a thickness of 80 to 130 nm. After aging, samples of (a) to (i) were also coated on silicon wafers, baked for 60 sec at 240° C. to form a film having a thickness of 80 to 130 nm. The coated wafers (from both non-aged and aged) were evaluated by SEM. On aging, samples (a), (b), and (h) had greater dimple formation that the other samples.

Example 10

(a) A polymer solution [made by Braggone Oy, Finland, was synthesized using the following procedure: Phenyltrimethoxysilane (8.39 g, 5 mol %), tetraethoxysilane (140.86 g, 80 mol %) and Phenanthrene-9-triethoxysilane (43.27 g, 15 mol %) were weighed to a round bottom flask. 192.51 g of PGME was added to the round bottom flask. 57.81 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed from PGME to PGME (230 g of PGME was added). After the solvent exchange the material solution was refluxed at 120 C for 2 hours. After the 2 hour refluxing step the material is ready to use after dilution and filtration. The material was diluted (by adding PGME) to 20% solid content and filtrated using 0.1 μm PTFE filter. This solution was further diluted using PnP (Propylene glycol propyl ether) to result in 11% solution (1:1, PGME:PnP).] was characterized using H-NMR. The H-NMR measurements indicate that there were both alkoxy groups and hydroxyl groups present after the synthesis. The ratio of hydroxyl groups to alkoxy groups was 3:1, as determined by NMR. The polymer solution was further diluted and filtered again using 0.2 μm filter. The filtered solution was applied to a silicon wafer by spin coating and baked at 250° C. for 90 seconds, forming a film having a thickness of 100 nm as measured on a J. A. Woollam® VUV VASE® Spectroscopic Ellipsometer.

(b) A polymer solution [made by Braggone Oy, Finland, was synthesized using the following procedure: Phenyltrimethoxysilane (8.39 g, 5 mol %), tetraethoxysilane (140.86 g, 80 mol %) and Phenanthrene-9-triethoxysilane (43.27 g, 15 mol %) were weighed to a round bottom flask. 192.51 g of PGME was added to the round bottom flask. 57.81 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed from PGME to PGME (230 g of PGME was added). After the solvent exchange the material solution was refluxed at 120 C for 2 hours. After the 2 hour refluxing step the material is ready to use after dilution and filtration. The material was diluted (by adding PGME) to 20% solid content and filtrated using 0.1 μm PTFE filter. This solution was further diluted using NPA (n-propyl acetate) to result in 11% solution (1:1, PGME:NPA).] was characterized using H-NMR. The H-NMR measurements indicate that there were both alkoxy groups and hydroxyl groups present after the synthesis. The ratio of hydroxyl groups to alkoxy groups was 3:1, as determined by NMR. The polymer solution was further diluted and filtered again using 0.2 μm filter. The filtered solution was applied to a silicon wafer by spin coating and baked at 250° C. for 90 seconds, forming a film having a thickness of 100 nm as measured on a J. A. Woollam® VUV VASE® Spectroscopic Ellipsometer.

(c) A polymer solution [made by Braggone Oy, Finland, was synthesized using the following procedure: Phenyltrimethoxysilane (8.39 g, 5 mol %), tetraethoxysilane (140.86 g, 80 mol %) and Phenanthrene-9-triethoxysilane (43.27 g, 15 mol %) were weighed to a round bottom flask. 192.51 g of PGME was added to the round bottom flask. 57.81 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed from PGME to PGME (230 g of PGME was added). After the solvent exchange the material solution was refluxed at 120 C for 2 hours. After the 2 hour refluxing step the material is ready to use after dilution and filtration. The material was diluted (by adding PGME) to 20% solid content and filtrated using 0.1 μm PTFE filter. This solution was further diluted using NBA (n-butyl acetate) to result in 11% solution (1:1, PGME:NBA).] was characterized using H-NMR. The H-NMR measurements indicate that there were both alkoxy groups and hydroxyl groups present after the synthesis. The ratio of hydroxyl groups to alkoxy groups was 3:1, as determined by NMR. The polymer solution was further diluted and filtered again using 0.2 μm filter. The filtered solution was applied to a silicon wafer by spin coating and baked at 250° C. for 90 seconds, forming a film having a thickness of 100 nm as measured on a J. A. Woollam® VUV VASE® Spectroscopic Ellipsometer.

(d) A polymer solution [made by Braggone Oy, Finland, was synthesized using the following procedure: Phenyltrimethoxysilane (13.10 g, 5 mol %), tetraethoxysilane (220.00 g, 80 mol %) and Phenanthrene-9-triethoxysilane (67.58 g, 15 mol %) were weighed to a round bottom flask. 601.32 g of acetone was added to the round bottom flask. 90.29 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed from acetone to PGMEA (380 g of PGMEA was added). After the solvent exchange the material solution was refluxed at 120 C for 2 hours. After the 2 hour refluxing step the material is ready to use after dilution and filtration. The material was diluted (by adding PGMEA) to 20% solid content and filtrated using 0.1 μm PTFE filter. This solution was further diluted using PnP to result in 11% solution (1:1, PGME:PnP).] was characterized using H-NMR. The H-NMR measurements indicate that there were no alkoxy groups present after the synthesis, only hydroxyl groups were present. The polymer solution was further diluted and filtered again using 0.2 μm filter. The filtered solution was applied to a silicon wafer by spin coating and baked at 250° C. for 90 seconds, forming a film having a thickness of 100 nm as measured on a J. A. Woollam® VUV VASE® Spectroscopic Ellipsometer.

(e) A polymer solution [made by Braggone Oy, Finland, was synthesized using the following procedure: Phenyltrimethoxysilane (13.10 g, 5 mol %), tetraethoxysilane (220.00 g, 80 mol %) and Phenanthrene-9-triethoxysilane (67.58 g, 15 mol %) were weighed to a round bottom flask. 601.32 g of acetone was added to the round bottom flask. 90.29 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed from acetone to PGMEA (380 g of PGMEA was added). After the solvent exchange the material solution was refluxed at 120 C for 2 hours. After the 2 hour refluxing step the material is ready to use after dilution and filtration. The material was diluted (by adding PGMEA) to 20% solid content and filtrated using 0.1 μm PTFE filter. This solution was further diluted using NPA to result in 11% solution (1:1, PGME:NPA).] was characterized using H-NMR. The H-NMR measurements indicate that there were no alkoxy groups present after the synthesis, only hydroxyl groups were present. The polymer solution was further diluted and filtered again using 0.2 μm filter. The filtered solution was applied to a silicon wafer by spin coating and baked at 250° C. for 90 seconds, forming a film having a thickness of 100 nm as measured on a J. A. Woollam® VUV VASE® Spectroscopic Ellipsometer.

(f) A polymer solution [made by Braggone Oy, Finland, was synthesized using the following procedure: Phenyltrimethoxysilane (13.10 g, 5 mol %), tetraethoxysilane (220.00 g, 80 mol %) and Phenanthrene-9-triethoxysilane (67.58 g, 15 mol %) were weighed to a round bottom flask. 601.32 g of acetone was added to the round bottom flask. 90.29 g of water (0.01 M HCl) was added to the reaction flask within 5 min, while constantly stirring the reaction mixture using a magnetic stirrer. After this the reaction mixture was stirred at RT for 15 min and refluxed for 5 hours using electric mantel. After refluxing a solvent exchange procedure was performed from acetone to PGMEA (380 g of PGMEA was added). After the solvent exchange the material solution was refluxed at 120 C for 2 hours. After the 2 hour refluxing step the material is ready to use after dilution and filtration. The material was diluted (by adding PGMEA) to 20% solid content and filtrated using 0.1 μm PTFE filter. This solution was further diluted using NBA to result in 11% solution (1:1, PGME:NBA).] was characterized using H-NMR. The H-NMR measurements indicate that there were no alkoxy groups present after the synthesis, only hydroxyl groups were present. The polymer solution was further diluted and filtered again using 0.2 μm filter. The filtered solution was applied to a silicon wafer by spin coating and baked at 250° C. for 90 seconds, forming a film having a thickness of 100 nm as measured on a J. A. Woollam® VUV VASE® Spectroscopic Ellipsometer.

Samples of each of (a) to (f) were filtered using a 0.2 μm filter and then split into two portions—one portion was stored at 5° C.; the other portion was stored at 40° C. for seven days. After seven days, samples of the 5° C. and 40° C. stored samples were coated on silicon wafers (2500 rpm on ACT-12, baked at 240° C./60 seconds). The wafers were then evaluated.

Samples 10(a) to 10(e) were compared to sample 9(a).

Sample 9(a) showed more than a 50% increase in molecular weight as measured by GPC. Samples 10(a), 10(b), and 10(c) showed little or no increase in molecular weight as measured by GPC. Sample 9(a) had greater dimple formation than Samples 10(a), 10(b), or 10(c). As compared to Sample 9(a), Samples 10(d), 10(e), and 10(f), had fewer number of dimples, but Samples 10(d), 10(e), and 10(f), had greater number of dimples than Samples 10(a), 10(b), and 10(c). Sample 10(d) had the least change in molecular weight, while Samples 10(e) and 10(f) had the greatest.

The foregoing description of the invention illustrates and describes the invention. Additionally, the disclosure shows and describes only certain embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

The invention claimed is:

1. A polymer comprising a siloxane polymer having at least one Si—OH group and at least one Si—OR group, where R is condensation stabilizing group optionally having a reactive functional group, wherein the siloxane polymer, when placed into propylene glycol monomethyl ether solvent at 20 weight % solid, has a weight average molecular weight increase of less than or equal to 50% after aging for one week at 40° C. as measured by GPC, and wherein the siloxane polymer comprises units of M-type, D-type T-type and Q-type, such that at least one unit of trifunctional silane T-type, and one unit of tetrafunctional silane Q-type, are present, where $R_a$, $R_b$, and $R_c$ are selected from the group consisting of hydrocarbon, epoxy-functional, and anhydride-functional groups, and $R_{10}$ is selected from the group consisting of alkyl, alkenyl, alkynyl, cycloalkyl, aryl, alkaryl, aralkyl, (alkyl)acrylate, (alkyl)acryloxyalkyl, (alkyl)acryloxyalkenyl, an epoxy-functional group, and an anhydride-functional group;

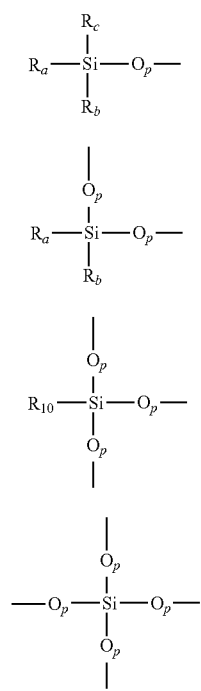

wherein p has a value of 0.5 when the associated oxygen atom is bonded to another silicon atom, and a value of 1 when the associated oxygen atom is bonded to other than a silicon atom, with the proviso that at least one p in each T and Q unit has a value of 0.5; and further where the sum of the number of T and Q units in the siloxane polymer being greater than or equal to 50% of the sum of M, D, T and Q-type units.

2. The polymer of claim 1 wherein the condensation stabilizing group is derived from a compound selected from the group consisting of (i) $R_1R_2R_3SiR_4$, and (ii) $(R_{12})_3Si$—Y—$Si(R_{12})_3$, where each of $R_1$, $R_2$, $R_3$, and $R_4$ are individually selected from the group consisting of hydrogen, halide, $C_{1-10}$ alkyl, $C_{2-4}$ alkenyl, $C_{3-10}$ cycloalkyl, aryl, $C_{1-10}$ alkoxy, acyloxy, aryloxy, siloxy, siloxysilane, and $NR_8R_9$, where each of $R_8$ and $R_9$ are selected from $C_{1-10}$ alkyl, and ON=$CR_6R_7$, where $R_6$ and $R_7$ are each individually selected from the group consisting of hydrogen and $C_{1-10}$ alkyl, or where $R_6$ and $R_7$ together with the carbon atom to which they are bound form a $C_{3-6}$ cycloalkyl ring, and further where each $R_{12}$ is individually selected from the group consisting of $C_{1-4}$ alkyl, $C_{1-4}$ alkoxy, and halogen; and where Y is a linking group.

3. The polymer of claim 2 wherein the compound has the formula $(R_{12})_3Si$—Y—$Si(R_{12})_3$, where each $R_{12}$ is individually selected from the group consisting of $C_{1-4}$ alkyl, $C_{1-4}$ alkoxy, and halogen; and Y is a linking group.

4. The polymer of claim 3 wherein Y is selected from the group consisting of alkylene, —O-alkylene-O—, alkylene-O-alkylene, alkylene-$Z_1C$(=O)$Z_2$-alkylene, and —O-alkylene-$Z_1C$(=O)$Z_2$-alkylene-O—, where $Z_1$ and $Z_2$ are each selected from the group consisting of a direct bond and —O—.

5. The polymer of claim 1 wherein the Si—OH groups and Si—OR groups are present in a ratio of from about 1:5 to about 5:1.

6. A method of making a stabilized polymer as claimed in claim 1 comprising the steps of: forming a siloxane polymer having at least one Si—OH group; and reacting at least one but not all of said Si—OH groups with a compound capable of providing a condensation stabilizing group optionally having a reactive functional group, wherein the stabilized polymer, when placed into propylene glycol monomethyl ether solvent at 20 weight % solid, has a weight average molecular weight increase of less than or equal to 50% after aging for one week at 40° C. as measured by GPC.

7. An antireflective coating composition comprising:
a) a polymer comprising a siloxane polymer having at least one Si—OH group and at least one Si—OR group, where R is condensation stabilizing group optionally having a reactive functional group, wherein the siloxane polymer, when placed into propylene glycol monomethyl ether solvent at 20 weight % solid, has a weight average molecular weight increase of less than or equal to 50% after aging for one week at 40° C. as measured by GPC; and
b) a solvent,
wherein the polymer has at least one Si—OH group and at least one Si—OR group, where R is a condensation stabilizing group optionally having a reactive functional group, wherein the condensation stabilizing group R was introduced by replacing some, but not all Si—OH by reacting the polymer with a compound selected from the group consisting of trimethoxysilane, triethoxysilane, methyl dimethoxysilane, ethyl diethoxysilane, methyl dimethoxychlorosilane, methyl methoxydichlorosilane, diphenyl dichlorosilane, dimethyl t-butylchlorosilane, dimethyl methoxychlorosilane, methyl dimethoxychlorosilane, ethylmethoxydichlorosilane, diethyl methoxychlorosilane, tetramethoxysilane, tetraethoxysilane, tetra-n-propoxysilane, tetra-i-propoxysilane, tetra-n-butoxysilane, methyltrimethoxysilane, methyltriethoxysilane, ethyltrimethoxysilane, ethyltriethoxysilane, n-propyltrimethoxysilane, n-propyltriethoxysilane, i-propyltrimethoxysilane, propyltriethoxysilane, n-butyltrimethoxysilane, n-butyltriethoxysilane, n-pentyltrimethoxysilane, n-hexyltrimethoxysilane, n-heptyltrimethoxysilane, n-octyltrimethoxysilane, vinyltrimethoxysilane, vinyltriethoxysilane, cyclohexyltrimethoxysilane, cyclohexyltriethoxysilane, phenyltrimethoxysilane, phenyltriethoxysilane, 3-chloropropyltrimethoxysilane, 3-chloropropyltriethoxysilane, 3,3,3-trifluoropropyltrimethoxysilane, 3,3,3-trifluoropropyltriethoxysilane, 2-hydroxyethyltrimethoxysilane, 2-hydroxyethyltriethoxysilane, 2-hydroxypropyltrimethoxysilane, 2-hydroxypropyltriethoxysilane, 3-hydroxypropyltrimethoxysilane, 3-hydroxypropyltriethoxysilane, 3-mercaptopropyltrimethoxysilane, 3-mercaptopropyltriethoxysilane, 3-isocyanatepropyltrimethoxysilane, 3-isocyanatepropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyl-triethoxysilane, (3-glycidoxypropyl)tripropoxysilane, 3-glycidoxypropyltri(2-methoxyethoxy)silane, 2,3-epoxypropyltriethoxysilane, 3,4-epoxybutyltriethoxysilane, 4,5-epoxypentyltriethoxysilane, 5,6-epoxyhexyltriethoxysilane, 5,6-epoxyhexyltrimethoxysilane, 4-(trimethoxysilyl)butane-1,2-epoxide, 3-(triethoxysilyl)propylsuccinic anhydride, 3-(trimethoxysilyl)propylsuccinic anhydride, 3-(methyldimethoxysilyl)propylsuccinic anhydride, 3-(methyldiethoxysilyl)propylsuccinic anhydride, 3-ureidopropyltrimethoxysilane, 3-ureidopropyltriethoxysilane, dimethyldimethoxysilane, dimethyldiethoxysilane, diethyldimethoxysilane, diethyldiethoxysilane, di-n-propyldimethoxysilane, di-n-propyldiethoxysilane, di-i-propyldimethoxysilane, di-i-propyldiethoxysilane, di-n-butyldimethoxysilane, di-n-butyldiethoxysilane, di-n-pentyldimethoxysilane, di-n-pentyldiethoxysilane, di-n-hexyldimethoxysilane, di-n-hexyldiethoxysilane, di-n-heptyldimethoxysilane, di-n-heptyldiethoxysilane, di-n-octyldimethoxysilane, di-n-octyldiethoxysilane, di-n-cyclohexyldimethoxysilane, di-n-cyclohexyldiethoxysilane, diphenyldimethoxy-silane, diphenyldiethoxysilane, methyltriacetyloxysilane, dimethyldiacetyloxy-silane, N-(3-triethoxysilylpropyl)-4-hydroxybutyramide, 3-(triethoxysilylpropyl)-p-nitrobenzamide, triethoxysilylpropylethylcarbamate, vinyltris(methylethylketoximino)silane, vinylmethyl-bis(methylethylketoximino)silane, tetrakis(methylethylketoximino)silane, phenyltris(methylethylketoximino)silane, diphenylbis(methylethylketoximino)-silane, dimethylbis(methylethylketoximino)silane, methyltris(methylethylketoximino)silane, 2-hydroxy-4-(3-triethoxysilylpropoxy)-diphenylketone, and 2-hydroxy-4-(3-methyldiethoxysilylpropoxy)diphenylketone, bis(triethoxysilyl)ethane, 2,2-bis(allyloxymethyl)-1-trimethylsiloxybutane, 2,2-bis(3-triethoxysilylpropoxymethyl)-1-trimethylsiloxybutane, 3,3-bis(trichlorosilylpropoxymethyl)-5-oxa-tridecane, and 1,3-bis(3-trichlorosilylpropoxy)-2-decyloxypropane, and mixtures thereof.

8. The composition of claim 7 wherein for b), the solvent is an alcohol.

9. A method for forming a photoresist relief image comprising: applying on a substrate a layer of the composition of claim 7; applying a layer of chemically-amplified photoresist composition on top of said layer of composition of claim 7; imagewise exposing the layers to actinic radiation; postexposure baking the substrate; and developing the photoresist layer with an aqueous alkaline solution.

10. The polymer antireflective coating composition of claim 7 wherein the Si—OH groups and Si—OR groups are present in a ratio of from about 1:5 to about 5:1.

11. The antireflective coating composition of claim 7, wherein the Si—OH groups and Si—OR groups are present in a ratio of from about 1:5 to about 1:1.

12. An antireflective coating composition comprising:
a) a polymer comprising a siloxane polymer having at least one Si—OH group and at least one Si—OR group, where R is condensation stabilizing group optionally having a reactive functional group, wherein the siloxane polymer, when placed into propylene glycol monomethyl ether solvent at 20 weight % solid, has a weight average molecular weight increase of less than or equal to 50% after aging for one week at 40° C. as measured by GPC; and
b) a solvent,
wherein the siloxane polymer comprises
units of M-type, D-type T-type and Q-type, such that at least one unit of T-type, trifunctional silane, and one unit Q-type, tetrafunctional silane are present, where $R_a$, $R_b$, and $R_c$ are selected from hydrocarbon, epoxy-functional, and anhydride-functional groups, and $R_{10}$ is selected from the group consisting of alkyl, alkenyl, alkynyl, cycloalkyl, aryl, alkaryl, aralkyl, (alkyl)acrylate, (alkyl)acryloxyalkyl, (alkyl)acryloxyalkenyl, an epoxy-functional group, and an anhydride-functional group;

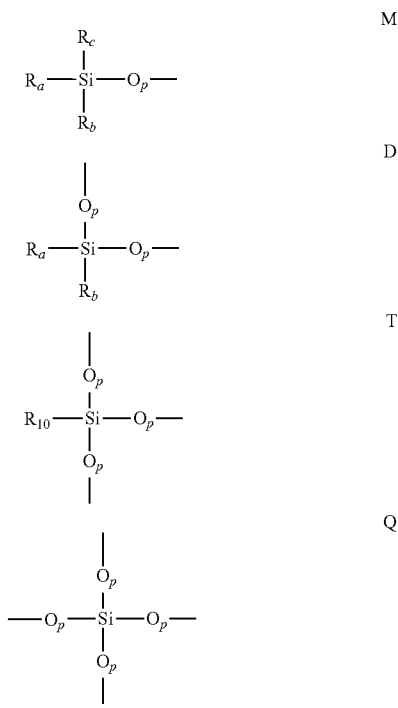

wherein p has a value of 0.5 when the associated oxygen atom is bonded to another silicon atom, and a value of 1 when the associated oxygen atom is bonded to other than a silicon atom, with the proviso that at least one p in each T and Q unit has a value of 0.5; and further where each $R_{10}$ is independently selected from the group consisting of alkyl, alkenyl, alkynyl, cycloalkyl, aryl, alkaryl, aralkyl, (alkyl)acrylate, (alkyl)acryloxyalkyl, (alkyl)acryloxyalkenyl, an epoxy-functional group and an anhydride-functional group; and further where the sum of the number of T and Q units in the siloxane polymer being greater than or equal to 50% of the sum of M, D, T, and Q-type units.

13. The antireflective coating composition polymer of claim 12 where at least one $R_{10}$ of the trifunctional siloxane units (T) is aryl.

14. The composition of claim 12 wherein for b), the solvent is an alcohol.

15. The polymer antireflective coating composition of claim 12 wherein the Si—OH groups and Si—OR groups are present in a ratio of from about 1:5 to about 5:1.

16. The antireflective coating composition of claim 12, wherein the Si—OH groups and Si—OR groups are present in a ratio of from about 1:5 to about 1:1.

* * * * *